United States Patent
Broekaart et al.

(10) Patent No.: US 12,183,624 B2
(45) Date of Patent: Dec. 31, 2024

(54) PROCESS FOR PRODUCING A RECEIVER SUBSTRATE FOR A SEMICONDUCTOR-ON-INSULATOR STRUCTURE FOR RADIOFREQUENCY APPLICATIONS AND PROCESS FOR PRODUCING SUCH A STRUCTURE

(71) Applicant: Soitec, Bernin (FR)

(72) Inventors: Marcel Broekaart, Theys (FR); Damien Parissi, Saint-Paul-De-Varces (FR)

(73) Assignee: Soitec, Bernin (FR)

( * ) Notice: Subject to any disclaimer, the term of this patent is extended or adjusted under 35 U.S.C. 154(b) by 278 days.

(21) Appl. No.: 17/414,858

(22) PCT Filed: Jan. 8, 2020

(86) PCT No.: PCT/FR2020/050028
§ 371 (c)(1),
(2) Date: Jun. 16, 2021

(87) PCT Pub. No.: WO2020/144438
PCT Pub. Date: Jul. 16, 2020

(65) Prior Publication Data
US 2021/0407849 A1    Dec. 30, 2021

(30) Foreign Application Priority Data
Jan. 9, 2019   (FR) ...................... 1900194

(51) Int. Cl.
*H01L 21/762*   (2006.01)
*H01L 21/02*    (2006.01)

(52) U.S. Cl.
CPC .................. *H01L 21/76254* (2013.01); *H01L 21/02236* (2013.01)

(58) Field of Classification Search
CPC ......... H01L 21/76254; H01L 21/02236; H01L 21/02002; H01L 21/32105
See application file for complete search history.

(56) References Cited

U.S. PATENT DOCUMENTS

| 7,772,087 B2 * | 8/2010 | Nguyen | ............ | H01L 21/76254 438/459 |
| 2001/0017294 A1 | 8/2001 | Aoki et al. | | |

(Continued)

FOREIGN PATENT DOCUMENTS

| EP | 1463121 B1 | 4/2011 |
| FR | 2914492 A1 | 10/2008 |

(Continued)

OTHER PUBLICATIONS

Singapore Written Opinion for Application No. 11202104395W dated Jan. 31, 2023, 8 pages.

(Continued)

*Primary Examiner* — Dale E Page
*Assistant Examiner* — Quovaunda Jefferson
(74) *Attorney, Agent, or Firm* — TraskBritt

(57) ABSTRACT

A process for producing a receiver substrate for a semiconductor-on-insulator structure for radiofrequency application comprises the following steps:—providing a semiconductor substrate comprising a base substrate made of monocrystalline material and a charge-trapping layer made of polycrystalline silicon arranged on the base substrate;—oxidizing the charge-trapping layer to form an oxide layer arranged on the charge-trapping layer. The oxidation of the charge-trapping layer is performed at least partly at a temperature lower than or equal to 875° C., in the following manner:—starting the oxidization at a first temperature ($T_1$) between 750° C. and 1000° C.;—decreasing the temperature down to a second temperature ($T_2$), lower than the first temperature ($T_1$), (Continued)

between 750° C. and 875° C.;—continuing the oxidization at the second temperature ($T_2$).

19 Claims, 4 Drawing Sheets

(56) References Cited

U.S. PATENT DOCUMENTS

| | | |
|---|---|---|
| 2005/0148163 A1 | 7/2005 | Nguyen et al. |
| 2017/0316968 A1 | 11/2017 | Peidous et al. |
| 2018/0138080 A1 | 5/2018 | Usenko |

FOREIGN PATENT DOCUMENTS

| | | |
|---|---|---|
| JP | 58-067046 A | 4/1983 |
| JP | 08-255905 A | 10/1996 |
| JP | 2002-141343 A | 5/2002 |
| JP | 2014-509087 A | 4/2014 |
| JP | 2017-538288 A | 12/2017 |
| TW | 490604 B | 6/2002 |
| WO | 2016/081356 A1 | 5/2016 |
| WO | 2019/002080 A1 | 1/2019 |

OTHER PUBLICATIONS

International Search Report for International Application No. PCT/FR2020/050028 dated Apr. 29, 2020, 2 pages.
International Written Opinion for International Application No. PCT/FR2020/050028 dated Apr. 29, 2020, 7 pages.
Yang et al., Effect of Physical Stress on the Degradation of Thin SiO2 Films under Electrical Stress, IEEE Transactions on Electron Devices, vol. 47, No. 4, (Apr. 2000), pp. 746-755.
Taiwanese Office Action for Application No. 109100617 dated Sep. 13, 2023, 4 pages.
Japanese Notice of Reasons for Refusal for Japanese Application No. 2021-532344, dated Dec. 5, 2023, 2 pages with English translation.

\* cited by examiner

PROCESS FOR PRODUCING A RECEIVER SUBSTRATE FOR A SEMICONDUCTOR-ON-INSULATOR STRUCTURE FOR RADIOFREQUENCY APPLICATIONS AND PROCESS FOR PRODUCING SUCH A STRUCTURE

CROSS-REFERENCE TO RELATED APPLICATIONS

This application is a national phase entry under 35 U.S.C. § 371 of International Patent Application PCT/FR2020/050028, filed Jan. 8, 2020, designating the United States of America and published as International Patent Publication WO 2020/144438 A1 on Jul. 16, 2020, which claims the benefit under Article 8 of the Patent Cooperation Treaty to French Patent Application Serial No. 1900194, filed Jan. 9, 2019.

TECHNICAL FIELD

The present disclosure relates to the fabrication of a substrate, called the "receiver substrate," for producing a semiconductor-on-insulator structure for radiofrequency applications. The present disclosure also relates to a process for fabricating such a structure via transfer of a layer of a second substrate, called the "donor substrate," to the receiver substrate.

BACKGROUND

In the context of fabrication of a semiconductor-on-insulator structure (acronym SeOI), a particular example thereof being a silicon-on-insulator (SOI) structure when the semiconductor is silicon, a donor substrate is bonded to a receiver substrate.

Generally, the donor substrate comprises a single-crystal semiconductor substrate, for example, a single-crystal silicon substrate, and the receiver substrate comprises at least one base substrate, in particular, intended to serve as carrier for a thin semiconductor layer that is transferred from the donor substrate to the receiver substrate.

An oxide layer is formed on the donor substrate or on the receiver substrate, so that the oxide layer is located at the bonding interface after the donor substrate and the receiver substrate have been bonded. The oxide layer is then said to be "buried," and called the "BOX" for Buried OXide.

For radiofrequency (RF) applications, a polysilicon (polycrystalline silicon) layer is integrated into the receiver substrate under the buried oxide layer, in order to trap electrical charge present at the interface between the base layer and the buried oxide layer. This polysilicon layer is arranged on the base layer of the receiver substrate before bonding.

The oxide layer is formed either on the substrate made of single-crystal semiconductor of the donor substrate, using a first process called "direct bonding," or on the polysilicon layer of the receiver substrate, using a second process called "reverse bonding."

With reference to FIG. 1, in the direct-bonding process a receiver substrate 10 comprising a base substrate 1 covered with a charge-trapping layer 2 made of polysilicon (polycrystalline silicon), and a donor substrate 20 comprising a substrate 4 made of single-crystal semiconductor, are provided. The substrate made of single-crystal material of the donor substrate is oxidized to form an oxide layer 3.

Next, atomic species are implanted into the layer 4 made of single-crystal material through the oxide layer 3, in order to form a zone called the "weakened zone" in the layer made of single-crystal material. The weakened zone is created at a defined depth that corresponds substantially to the thickness of the layer to be transferred. The layer to be transferred then comprises the oxide layer and a segment of the single-crystal substrate.

The donor substrate 20 is then bonded to the receiver substrate 10, the polysilicon charge-trapping layer 2 and the oxide layer 3 being at the bonding interface, then the donor substrate 20 is detached along the weakened zone, so as to transfer the oxide layer 3 and the segment of single-crystal substrate to the receiver substrate 10.

The direct-bonding process has the drawback that the oxide layer is located on the donor substrate. Thus, during the implantation, the atomic species must pass through the oxide layer before reaching the single-crystal layer, this requiring a high implantation energy. Now, the higher the implantation energy, the larger the amount of ions to be implanted must be, and the lower the implantation current (current density), this leading to an increase in production cost, limiting the feasibility of the process, and, in particular, limiting the maximum thickness of the oxide layer. In addition, this process decreases the reusability of the donor substrate, since some of the donor substrate is consumed to form the oxide layer.

With reference to FIG. 2, in the reverse-bonding process a receiver substrate 10 comprising a base substrate 1 covered with a charge-trapping layer 2 made of polysilicon, and a donor substrate 20 comprising a substrate 4 made of single-crystal semiconductor, are provided. However, in contrast to the direct-bonding process, the oxide layer 3 is formed directly on the receiver substrate 10 via oxidation of the charge-trapping layer 2.

To form the weakened zone, the implantation of atomic species is then carried out directly into the layer 4 made of single-crystal material of the donor substrate, and does not pass through the oxide layer 3. The layer to be transferred then solely comprises a segment of the single-crystal substrate.

The donor substrate is then bonded to the receiver substrate, the single-crystal substrate and the oxide layer being at the bonding interface, then the donor substrate is detached along the weakened zone, so as to transfer the segment of single-crystal substrate to the receiver substrate.

The reverse-bonding process allows production cost to be decreased and the reusability of the donor substrate to be improved.

In contrast, the oxide layer formed on the polysilicon layer has a breakdown voltage (Vbd) that is too low, with respect to that obtained by growth on the single-crystal material of the donor substrate (in particular, when it is a question of single-crystal silicon) in the direct-bonding process. The breakdown voltage is too low to be compatible with radiofrequency applications.

To illustrate this statement, FIG. 3 shows a graph that plots the variation in the electrical current, amperes (A), as a function of electric field, in megavolts per centimeter (MV/cm), for various receiver substrates in which the buried oxide layer was formed by direct bonding (substrate such as that in FIG. 1) or by reverse bonding (substrate such as that in FIG. 2) according to the prior art.

The two curves on the right in the graph, referenced $D_1$ and $D_2$, correspond to two substrates obtained by direct bonding. In these two substrates, the oxide layer was formed by oxidation of the single-crystal semiconductor of the donor substrate and was then transferred to the charge-trapping layer.

The five curves on the left in the graph, referenced $I_1$, $I_2$, $I_3$, $I_4$, and $I_5$, correspond to five substrates obtained by reverse bonding. In the substrates, the oxide layer was formed by oxidation of the charge-trapping layer made of polycrystalline silicon of the receiver substrate.

The electrical current was measured between ground and the free surface of the substrate by way of a piece of aluminum arranged on the oxide layer and a measurement probe.

Regarding the direct bonding, the two curves $D_1$ and $D_2$ exhibit a break in slope corresponding to a maximum electric field that the substrate may withstand before short-circuit of about 7 MV/cm. The value of the maximum electric field corresponding to the curve $D_2$ is slightly higher than that corresponding to the curve $D_1$.

Regarding the reverse bonding, the five curves $I_1$, $I_2$, $I_3$, $I_4$, and $I_5$ exhibit a break in slope corresponding to a maximum electric field that the substrate may withstand before short-circuit of about 3 MV/cm. The value of the maximum electric field increases between $I_1$ and $I_5$.

By comparison it may be seen that the value of the maximum electric field is clearly lower for substrates obtained by reverse bonding with respect to those obtained by direct bonding. The average distance between the two sets of curves is about 4 MV/cm.

Fabrication of a substrate by reverse bonding therefore induces a drop in the maximum electric field, this resulting in a corresponding drop in breakdown voltage.

BRIEF SUMMARY

One aim of the present disclosure is to provide a process allowing the aforementioned drawbacks to be overcome. The present disclosure aims to provide such a process allowing a receiver substrate to be fabricated for a semiconductor-on-insulator structure the buried oxide layer of which possesses a sufficient breakdown voltage for radiofrequency applications, while limiting production cost.

To this end, the present disclosure proposes a process for fabricating a receiver substrate for a semiconductor-on-insulator structure for radiofrequency applications, comprising the following steps:
  providing a semiconductor substrate comprising a base layer made of single-crystal material and a charge-trapping layer made of polysilicon arranged on the base layer,
  oxidizing the charge-trapping layer in order to form an oxide layer, arranged on the charge-trapping layer,
  the process being characterized in that the charge-trapping layer is oxidized at least partially at a temperature lower than or equal to 875° C., in the following way:
  starting the oxidation at a first temperature between 750° C. and 1000° C.,
  decreasing the temperature to a second temperature below the first temperature and between 750° C. and 875° C.,
  continuing the oxidation at the second temperature.

The temperatures lower than or equal to 875° C. are lower than the temperatures at which the oxidation of a trapping layer is usually carried out in the prior art. Specifically, it was discovered, surprisingly, that decreasing the temperature of oxidation of the charge-trapping layer allows the breakdown voltage of the formed oxide layer to be increased, contrary to what those skilled in the art in the field of radio frequencies would expect based on their current knowledge, such as, in particular, illustrated by publication [1].

The oxidation of the charge-trapping layer made of polysilicon consumes the polysilicon, and the rate of formation of the oxide depends on the crystal orientation of the polysilicon grains. Thus, the fact that the crystal grains of the polysilicon layer are oriented differently causes the silicon oxide formed from these grains to grow at different rates. For example, the oxide grows at a different rate in the <100> direction and in the <111> direction, from grains oriented in the same <100> and <111> directions. The indices <100> and <111> are Miller indices, which allow the orientation of the planes in a crystal to be determined, and therefore the orientation of the crystal grains in the crystal structure to be expressed.

These differences in the growth rate of the oxide depending on the orientation of the crystal grains of the polysilicon generate mechanical stresses within the crystal structure, and most particularly at the interface between the oxide layer in growth and the subjacent polysilicon layer. As the volume of the oxide layer in growth increases and as the oxidation progresses, these stresses are amplified at the polysilicon surface.

According to other aspects, the proposed process has the following various features, which may be implemented alone or in technically feasible combinations thereof:
  the charge-trapping layer is oxidized at least partially at a temperature higher than or equal to 750° C. The oxidation rate is thus more compatible with industrial requirements and remains economically viable;
  the decrease in the temperature from the first temperature $T_1$ to the second temperature $T_2$ is gradual;
  at least 50%, and preferably at least 70%, of the thickness of the oxide layer is produced at the first temperature $T_1$, and at least 20%, and preferably at least 30%, of the thickness of the oxide layer is produced at the second temperature $T_2$;
  the formed oxide layer has a thickness between 200 nm and 400 nm;
  the charge-trapping layer has a thickness between 20 nm and 500 nm;
  the charge-trapping layer is deposited beforehand on the base substrate made of single-crystal material by low-pressure chemical vapor deposition in a reactor.

The present disclosure also relates to a process for fabricating a semiconductor-on-insulator structure for radiofrequency applications, characterized in that it comprises the following steps:
  fabricating a receiver substrate such as described above,
  providing a donor substrate comprising single-crystal substrate,
  bonding the donor substrate to the receiver substrate,
  transferring a layer of the donor substrate to the receiver substrate.

According to other aspects, the proposed process has the following various features, which may be implemented alone or in technically feasible combinations thereof:
  the layer transferred from the donor substrate comprises a semiconductor;
  the layer transferred from the donor substrate comprises a ferroelectric material;
  the ferroelectric material is chosen from: $LiTaO_3$, $LiNbO_3$, $LiAlO_3$, $BaTiO_3$, $PbZrTiO_3$, $KNbO_3$, $BaZrO_3$, $CaTiO_3$, $PbTiO_3$, $KTaO_3$.

the transfer comprises the following steps:
  implanting atomic species in the donor substrate so as to form a weakened zone that delineates a layer of single-crystal semiconductor or ferroelectric material to be transferred,
  bonding the donor substrate to the receiver substrate, the oxide layer and the layer of single-crystal semiconductor or ferroelectric material to be transferred being at the bonding interface,
  detaching the donor substrate along the weakened zone in order to transfer the layer of single-crystal semiconductor or ferroelectric material to the receiver substrate, the oxide layer being arranged between the charge-trapping layer and the transferred layer of single-crystal semiconductor or ferroelectric material.

The single-crystal semiconductor or ferroelectric material preferably lies at the surface of the donor substrate, the implantation of atomic species being carried out directly through the surface.

BRIEF DESCRIPTION OF THE DRAWINGS

Other advantages and features of the present disclosure will become apparent on reading the following description given by way of illustrative and nonlimiting example, with reference to the following accompanying figures.

For the sake of legibility of the figures, the various layers forming the substrates are not necessarily shown to scale.

DETAILED DESCRIPTION

Figure 1:
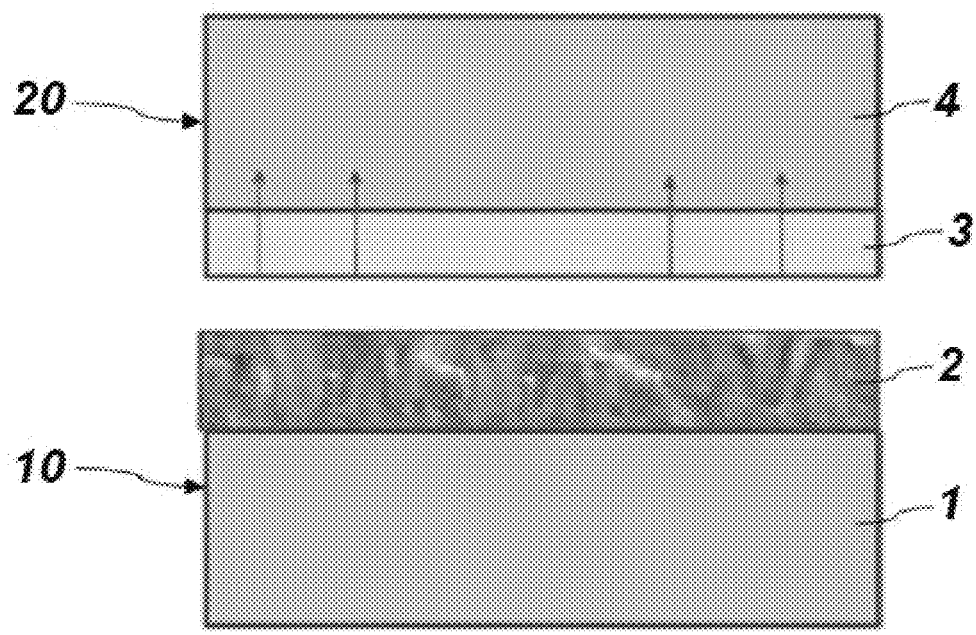
FIG. 1 is a diagram illustrating the fabrication of a semiconductor-on-insulator substrate for radiofrequency applications by direct bonding.
Figure 2:
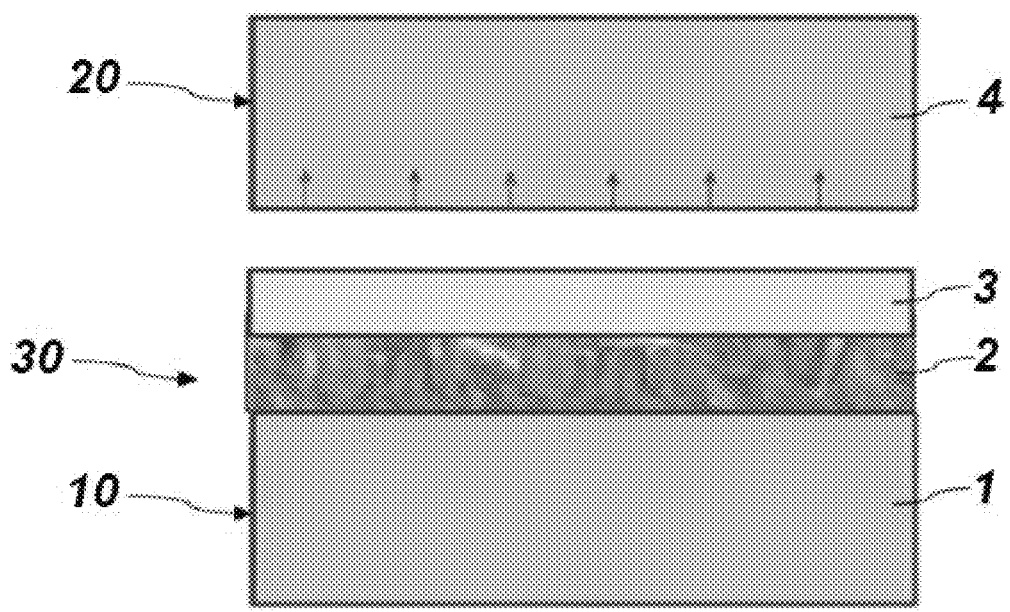
FIG. 2 is a diagram illustrating the fabrication of a semiconductor-on-insulator substrate for radiofrequency applications by reverse bonding.
Figure 3:
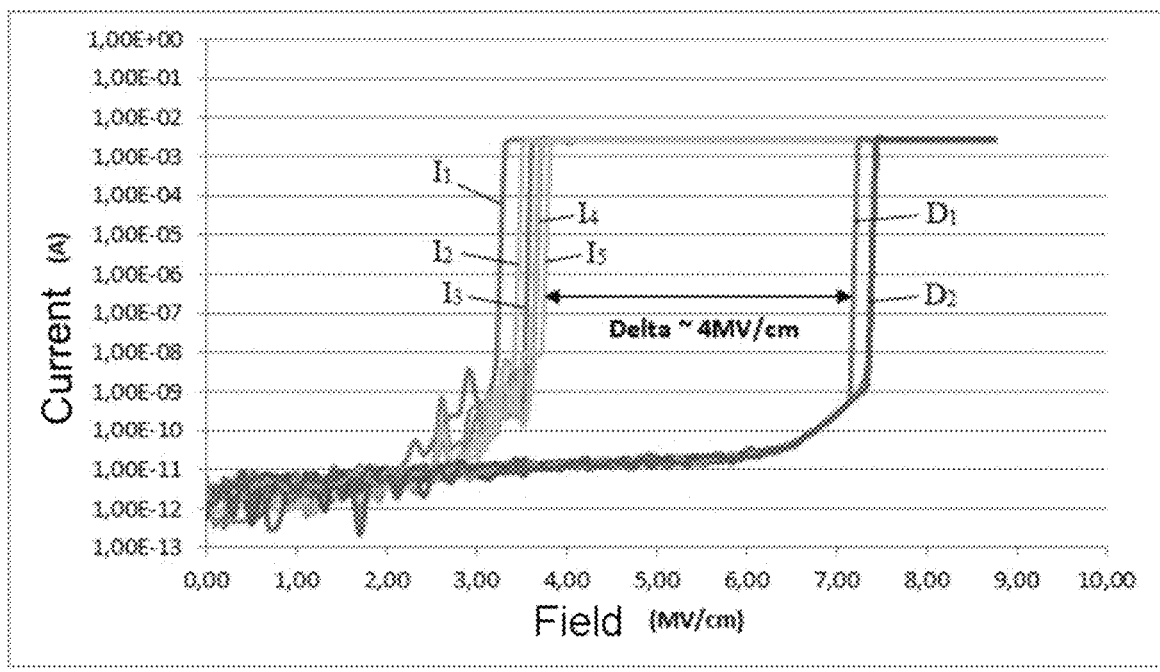
FIG. 3 is a graph that shows the variation in the magnitude of the current as a function of electric field, for various receiver substrates in which the buried oxide layer was formed by direct bonding or by reverse bonding according to the prior art.

The present disclosure relates to a process for fabricating a receiver substrate (30) for a semiconductor-on-insulator structure for radiofrequency applications, comprising the following steps:

The process according to the present disclosure is a reverse-bonding process. It comprises, with reference to FIG. 2, a step of providing a semiconductor substrate 10 comprising a base substrate 1 made of single-crystal material and a charge-trapping layer 2 made of polysilicon arranged on the base substrate, followed by a step of oxidizing the charge-trapping layer 2 to form an oxide layer 3 arranged on the charge-trapping layer.

The charge-trapping layer 2 may be formed by epitaxy on the base substrate 1, or alternatively deposited on the base substrate, in particular, by chemical vapor deposition (CVD).

The charge-trapping layer 2 is oxidized at least partially at a temperature between 750° C. and 875° C.

Such a process makes it possible to form, by reverse bonding, a receiver substrate 30, the oxide layer of which has a higher breakdown voltage than when the oxidation is carried out at a temperature above 875° C.

The formed oxide layer 3 has a thickness of a few hundred nanometers (nm), and preferably a thickness between 200 nm and 400 nm.

The charge-trapping layer remaining after the oxidation preferably has a thickness between 20 nm and 500 nm.

The expression "at least partially" means that the entirety of the oxidation is carried out at a temperature between 750° C. and 875° C., or that only some of the oxidation is carried out at a temperature between 750° C. and 875° C.

According to one embodiment, to begin with, the charge-trapping layer 2 is oxidized at a temperature $T_1$ comprised between 750° C. and 1000° C., and then the temperature is decreased, directly or gradually, until a temperature $T_2$ lower than $T_1$ and between 750° C. and 875° C. is reached, the oxidation then being continued.

The temperature $T_1$ may therefore be lower than 875° C., or indeed higher than 875° C. and, for example, equal to 900° C. or to 950° C.

In this embodiment, the upper segment of the oxide layer 3 is produced at the temperature $T_1$, whereas the lower segment of the oxide layer 3 is produced at the temperature $T_2$, which is lower than $T_1$. Specifically, the charge-trapping layer 2 is oxidized from its upper face to its lower face, and the oxidation interface moves from the upper face to the lower face as the reaction advances.

This embodiment allows the oxidation rate of the upper segment of the charge-trapping layer 2 to be increased since oxidation rate increases with temperature, and therefore the time required to oxidize the trapping layer to be decreased.

The increase in the breakdown voltage of the oxide layer 3 is observed both in the case where the entirety of the oxidation is carried out at a temperature between 750° C. and 875° C., and in the case where only some of the oxidation is carried out at a temperature between 750° C. and 875° C. Specifically, it is simply necessary for at least one segment of the charge-trapping layer 2, which extends from the interface between the charge-trapping layer and the base substrate toward the free surface of the charge-trapping layer, to be oxidized at a temperature between 750° C. and 875° C.

It is possible to adjust the oxidation parameters in order to minimize the segment of the charge-trapping layer produced at the temperature between 750° C. and 875° C., and therefore the total length of the oxidation step.

According to one embodiment, at least 50%, and preferably at least 70%, of the thickness of the oxide layer 3 is produced at the first temperature $T_1$, and at least 20%, and preferably at least 30%, of the thickness of the oxide layer is produced at the second temperature $T_2$.

A study of the variation in the time taken to grow an oxide layer as a function of temperature has been carried out, for crystals of different crystal orientations.

Figure 4:
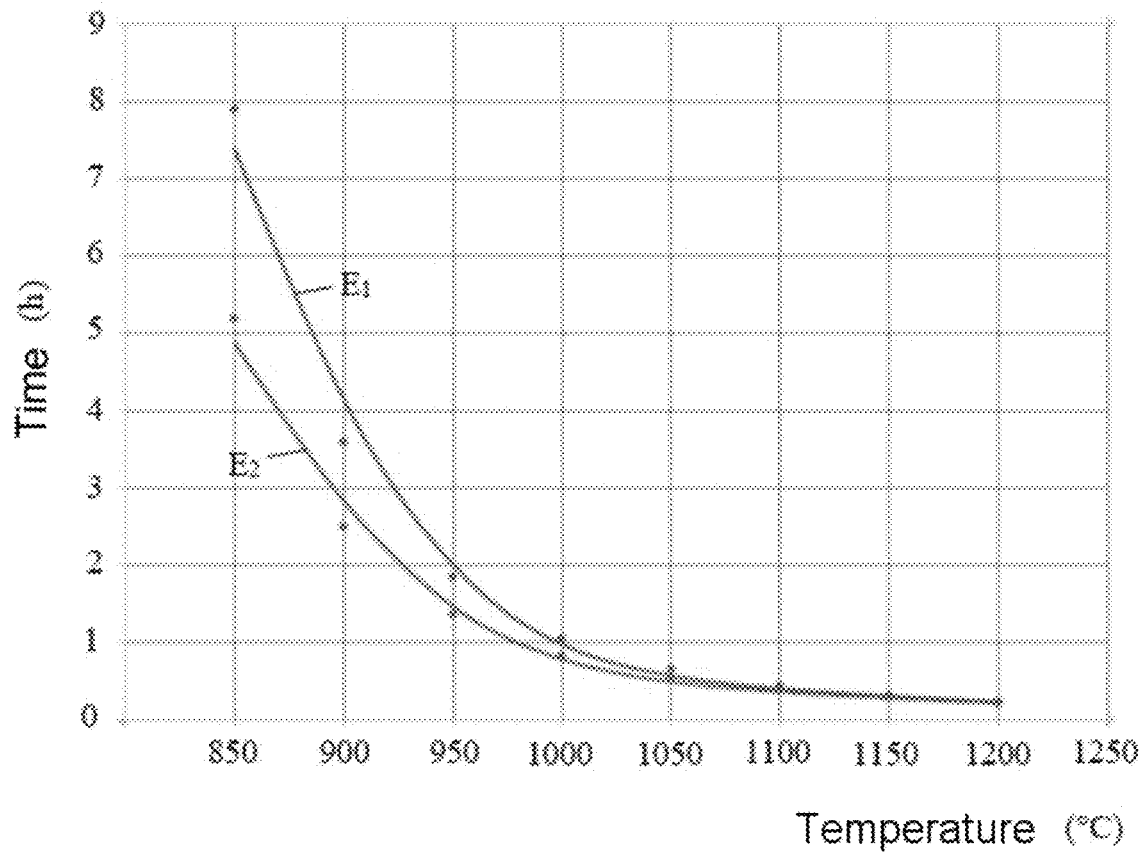
FIG. 4 is a graph that shows the growth time of an oxide layer of a thickness of 400 nm for oxide crystals of <100> and <111> Miller indices as a function of temperature.

FIG. 4 is a graph that shows the growth time (in hours) of an oxide layer of a thickness of 400 nm as a function of temperature (in degrees Celsius) for oxide crystals with the Miller indices <100> (curve $E_1$) and <111> (curve $E_2$).

Figure 5:
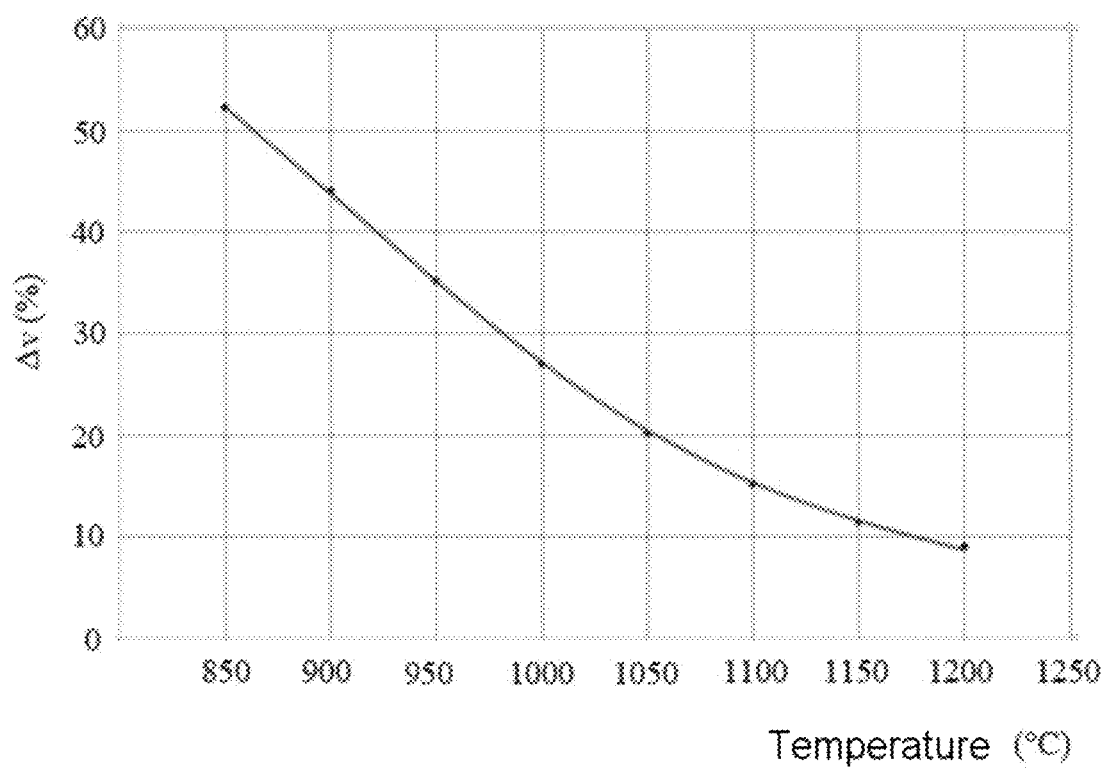
FIG. 5 is a graph that shows the variation in the difference between the two curves of FIG. 4 as a function of temperature.

FIG. 5 is a graph that shows the relative difference in growth rate $\Delta v$ (in relative percent) between oxide crystals with the Miller indices <100> (curve $E_1$) and <111> (curve $E_2$) of FIG. 4 as a function of temperature (in degrees Celsius).

These results show that the lower the temperature, the larger the difference in growth rate between the crystals of different <100> and <111> crystal orientations. In particular, this relative difference is about 48% when the temperature is 875° C., then increases for temperatures lower than 875° C. to above 50%.

In contrast, the higher the temperature, the smaller the difference in growth rate between the crystals of different <100> and <111> crystal orientations. In particular, this difference is about 9% when the temperature is 1200° C.

In addition, the oxidation time increases very greatly for temperatures lower than 1000° C., and even further for temperatures lower than 850° C. Thus, it is desirable not to drop below 750° C. in order for the process to be able to be carried out in a time compatible with industrial requirements and to remain economically viable.

The oxidation of the charge-trapping layer 2 is accompanied by the oxidation of the opposite side of the base substrate 1. On account of the difference in materials between the two sides of the substrate, the semiconductor substrate 10 comprising the base substrate 1 and the charge-trapping layer 2 deforms. This deformation affects the entire substrate, i.e., the curvature of the substrate in its entirety is modified such that it becomes concave or convex. When the substrate is disc-shaped, it will have a generally parabolic shape after deformation.

More precisely, during the oxidation, the charge-trapping layer 2 sustains the mechanical stresses of the oxide layer 3 in growth. The substrate then deforms convexly.

The terms "convex" and "concave" are to be understood with respect to the curvature of the side of the receiver substrate 30 that is intended to form the bonding interface with the donor substrate described below in the present text, which side is referred to as the "front side." Thus, the substrate is said to be "convex" when the curvature of the front side is convex, and said to be "concave" when the curvature of the front side is concave.

Figure 6:
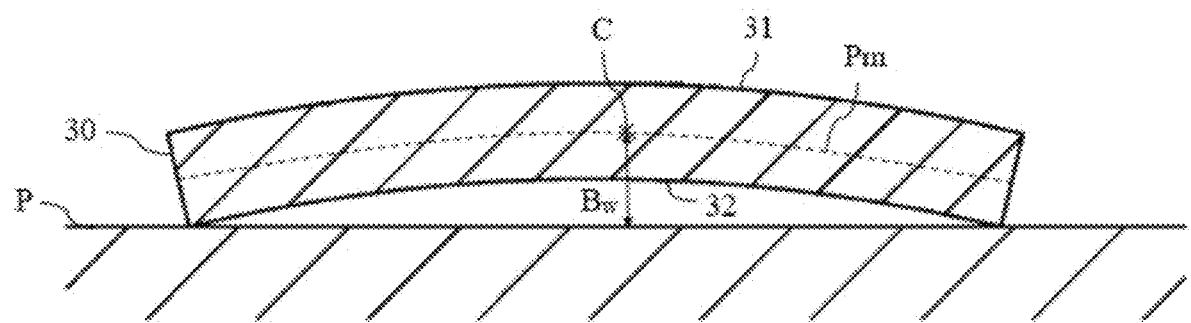
FIG. 6 is a schematic of the substrate of FIG. 2 obtained after oxidation of the charge-trapping layer, and having a convex curvature.

The receiver substrate 30 shown in FIG. 6 has deformed convexly. The front side 31 is the upper side. The back side 32 is parallel to the front side.

The curvature of the substrate is typically quantified via an amplitude parameter called bow and denoted Bw.

Bw corresponds to the distance between the central point C of the median plane Pm (shown by the dashed line) of the substrate and a reference plane P corresponding to a reference holder on which the substrate rests. Bw is positive in the case of a convex curvature (as shown in FIG. 6) and negative in the case of a concave curvature.

It has been noted that carrying out at least some of the oxidation of the charge-trapping layer 2 at a lower temperature than in the prior art, and, in particular, at a temperature comprised between 750° C. and 875° C., allows bow Bw to be decreased. The differences in curvature between the lower surface of the charge-trapping layer 2 at the interface with the base substrate 1 and the upper surface of the charge-trapping layer at the interface with the oxide layer 3 are thus decreased, thus decreasing mechanical stresses within the charge-trapping layer.

From the receiver substrate 30 obtained using the process described above, a semiconductor-non-insulator structure for radiofrequency applications is fabricated, using a fabricating process the steps of which are described below.

The receiver substrate 30, which comprises, in succession, the base substrate 1, the charge-trapping layer 2, and the oxide layer 3, is provided. A second substrate, called the donor substrate, which is made of a single-crystal material, is also provided.

Preferably, the donor substrate comprises a semiconductor substrate.

A weakened zone is formed in the donor substrate, so as to delineate a layer to be transferred.

The layer to be transferred is preferably a semiconductor layer.

The weakened zone is formed in the donor substrate at a predefined depth that corresponds substantially to the thickness of the layer to be transferred. Preferably, the weakened zone is created by implanting atomic species, for example, hydrogen and/or helium atoms, into the donor substrate. In practice, the implantation of the atomic species is preferably carried out directly through the single-crystal material at the free surface of the donor substrate.

The donor substrate is then bonded to the receiver substrate. The oxide layer and the layer to be transferred are located at the bonding interface.

The donor substrate is then detached along the weaken zone, in order to transfer the layer to the receiver substrate (SMARTCUT™ process). The final structure, in which the oxide layer is arranged between the charge-trapping layer and the transferred layer, is thus obtained.

Alternatively, the layer may be transferred by thinning the donor substrate from its side opposite the bonding interface, until the thickness desired for the layer is obtained.

According to one embodiment, the layer to be transferred of the donor substrate comprises a ferroelectric material.

The ferroelectric material is advantageously chosen from: $LiTaO_3$, $LiNbO_3$, $LiAlO_3$, $BaTiO_3$, $PbZrTiO_3$, $KNbO_3$, $BaZrO_3$, $CaTiO_3$, $PbTiO_3$ and $KTaO_3$.

The donor substrate of the single-crystal layer to be transferred may take the form of a circular wafer of standardized size, for example, of 150 mm or 200 mm diameter. The present disclosure is not however in any way limited to these dimensions or to this form. The wafer may have been obtained from an ingot of ferroelectric material, in such a way as to form a donor substrate having a preset crystal orientation. Alternatively, the donor substrate may comprise a layer of ferroelectric material joined to a carrier substrate.

The crystal orientation of the single-crystal layer of ferroelectric material to be transferred is chosen depending on the intended application. Thus, as regards the material $LiTaO_3$, it is conventional to choose an orientation comprised between 30° and 60° XY, or between 40° and 50° XY, in particular, in the case where it is desired to exploit the properties of the thin layer to form a SAW filter (SAW being the acronym of Surface Acoustic Wave). As regards the material $LiNbO_3$, it is conventional to choose an orientation of about 128° XY. However, the present disclosure is not in any way limited to a particular crystalline orientation.

Whatever the crystal orientation of the ferroelectric material of the donor substrate, the process, for example, comprises introducing hydrogen and/or helium species (ions and/or atoms) into this donor substrate. This introduction may correspond, for example, to a hydrogen implantation, i.e., a hydrogen ion bombardment of the planar face of the donor substrate.

As is known per se, the aim of the implanted ions is to form a weakened plane delineating a first layer of ferroelectric material to be transferred, which layer is located on the side of the face, and another portion forming the rest of the substrate. The nature, the dose of the implanted species and the type of ions implanted, and the implantation energy, are chosen depending on the thickness of the layer that it is desired to transfer and on the physicochemical properties of the donor substrate. In the case of a donor substrate made of $LiTaO_3$, it may thus be chosen to implant a dose of hydrogen of between 1E16 and 5E17 at/$cm^2$ with an energy of between 30 and 300 keV to delineate a first layer of about 20 to 2000 nm thickness.

EXPERIMENTAL RESULTS

Variation in the Magnitude of the Electrical Current in the Structure as a Function of Electric Field.

To illustrate the advantages achieved using the process of the present disclosure described above, a study of the variation in the electrical current in the structure as a function of electric field was carried out.

Figure 7:
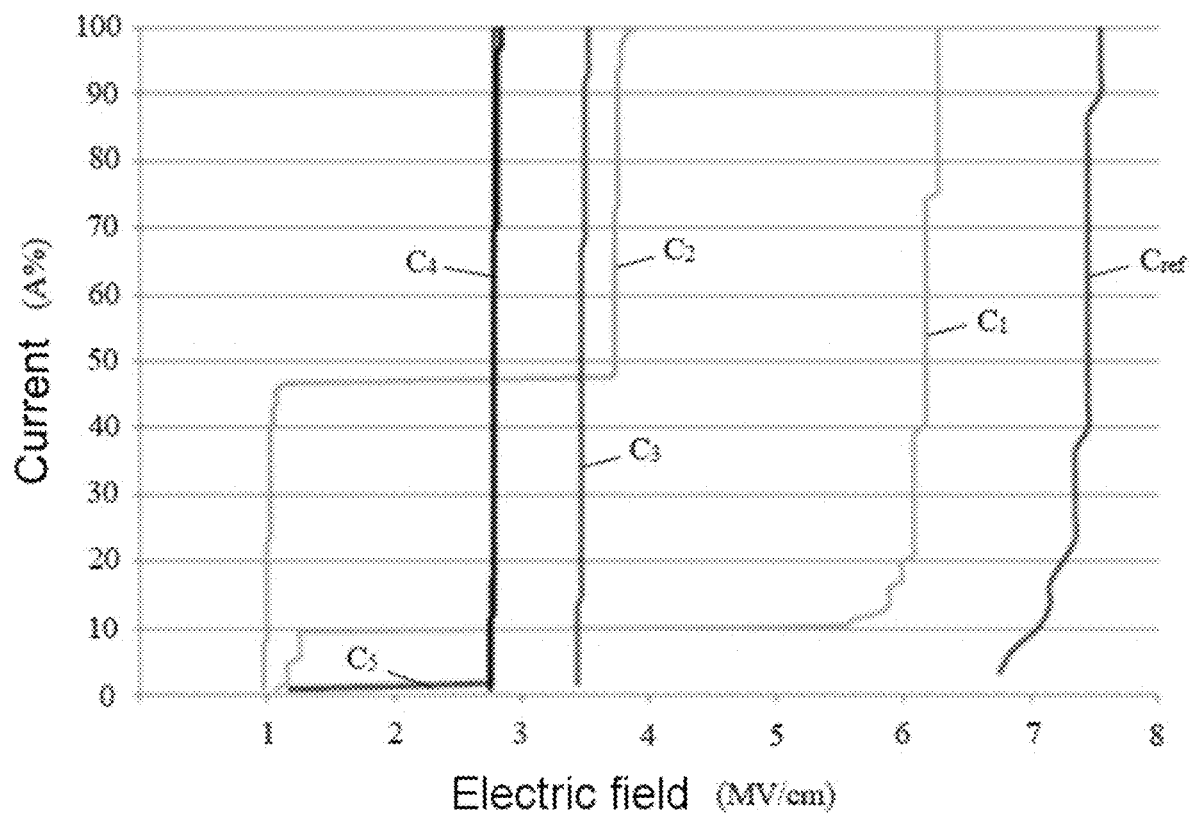
FIG. 7 is a graph that shows the variation in the magnitude of the current as a function of electric field, for various receiver substrates in which the buried oxide layer was formed by reverse bonding according to the present disclosure.

FIG. 7 shows a graph that plots the variation in the magnitude of the current, in amperes (A) multiplied by a factor of 100 in order to make the graph more legible, as a function of electric field, in megavolts per centimeter (MV/cm), for various substrates obtained by reverse bonding according to the present disclosure. The substrates differ in the conditions of formation of the oxidation of the receiver substrate used to form the buried oxide layer.

The electrical current was measured between ground and the free surface of the substrate by way of a piece of aluminum arranged on the oxide layer and a measurement probe.

The curves referenced $C_{ref}$, $C_1$, $C_2$, $C_3$, $C_4$, and $C_5$ plot the following:

the curve $C_{ref}$ corresponds to a reference, i.e., a substrate obtained by direct bonding, with an oxide layer of 4000 angstroms. It has a break in slope corresponding to a maximum electric field of about 7 MV/cm;

the curve $C_1$ corresponds to an oxidation entirely carried out at 850° C. without additional anneal. It has a maximum electric field of about 6 MV/cm;

the curve $C_2$ corresponds to an oxidation carried out at 950° C. then the temperature of which was increased to 1100° C. in a conventional oven for 1 hour. It has a maximum electric field of about 3.7 MV/cm;

the curve $C_3$ corresponds to an oxidation entirely carried out at 950° C. without thermal anneal. It has a maximum electric field of about 3.5 MV/cm;

the curve $C_4$ corresponds to an oxidation entirely carried out at 950° C. followed by a rapid thermal anneal (RTA) of 45 seconds at 1100° C. It has a maximum electric field of about 2.8 MV/cm;

the curve $C_5$ corresponds to an oxidation entirely carried out at 1000° C. followed by a rapid thermal anneal (RTA) of 45 seconds at 1100° C. It has a maximum electric field of about 2.8 MV/cm.

These results show that a decrease in the oxidation temperature allows the maximum electric field to be increased, this resulting in a corresponding increase in breakdown voltage.

REFERENCES

[1]: Effect of Physical Stress on the Degradation of Thin $SiO_2$ Films Under Electrical Stress, Tien-Chun Yang, 2000 IEEE.

The invention claimed is:

1. A method of fabricating a receiver substrate for a semiconductor-on-insulator structure for radiofrequency applications, comprising:
   providing a semiconductor substrate comprising a base substrate made of single-crystal material and a charge-trapping layer made of polysilicon arranged on the base substrate;
   oxidizing the charge-trapping layer to form an oxide layer on the charge-trapping layer; and
   wherein the charge-trapping layer is oxidized at least partially at a temperature lower than or equal to 875° C., in the following way:
   starting the oxidation at a first temperature ($T_1$) between 751° C. and 1000° C.;
   decreasing the temperature from the first temperature to a second temperature ($T_2$) below the first temperature ($T_1$) and in a range extending from 750° C. to 875° C.; and
   continuing the oxidation at the second temperature ($T_2$).

2. The method of claim 1, wherein the charge-trapping layer is oxidized at least partially at a temperature higher than 751° C.

3. The method of claim 2, wherein the decrease in the temperature from the first temperature ($T_1$) to the second temperature ($T_2$) is gradual.

4. The method of claim 3, wherein at least 50% of the thickness of the oxide layer is produced at the first temperature ($T_1$), and at least 20% of the thickness of the oxide layer is produced at the second temperature ($T_2$).

5. The method of claim 4, wherein the formed oxide layer has a thickness between 200 nm and 400 nm.

6. The method of claim 5, wherein the charge-trapping layer has a thickness between 20 nm and 500 nm.

7. The method of claim 6, wherein the charge-trapping layer is deposited on the base substrate by low-pressure chemical vapor deposition in a reactor.

8. The method of claim 4, wherein at least 70% of the thickness of the oxide layer is produced at the first temperature ($T_1$).

9. A method for fabricating a semiconductor-on-insulator structure for radiofrequency applications, comprising the following steps:
   fabricating a receiver substrate according to claim 1;
   providing a donor substrate comprising single-crystal substrate;
   bonding the donor substrate to the receiver substrate; and
   transferring a layer of the donor substrate to the receiver substrate.

10. The method of claim 9, wherein the layer transferred from the donor substrate comprises a semiconductor.

11. The method of claim 9, wherein the layer transferred from the donor substrate comprises a ferroelectric material.

12. The method of claim 11, wherein the ferroelectric material is chosen from among: $LiTaO_3$, $LiNbO_3$, $LiAlO_3$, $BaTiO_3$, $PbZrTiO_3$, $KNbO_3$, $BaZrO_3$, $CaTiO_3$, $PbTiO_3$, and $KTaO_3$.

13. The method of claim 9, wherein transferring the layer of the donor substrate to the receiver substrate comprises the following steps:
   implanting atomic species in the donor substrate so as to form a weakened zone that delineates a layer of single-crystal semiconductor or ferroelectric material to be transferred;

bonding the donor substrate to the receiver substrate, the oxide layer and the layer of single-crystal semiconductor or ferroelectric material to be transferred being at a bonding interface; and detaching the donor substrate along the weakened zone to transfer the layer of single-crystal semiconductor or ferroelectric material to the receiver substrate, the oxide layer being arranged between the charge-trapping layer and the transferred layer of single-crystal semiconductor or ferroelectric material.

14. The method of claim 13, wherein the single-crystal semiconductor or ferroelectric material lies at the surface of the donor substrate, the implantation of atomic species being carried out directly through the surface.

15. The method of claim 1, wherein the decrease in the temperature from the first temperature ($T_1$) to the second temperature ($T_2$) is gradual.

16. The method of claim 1, wherein at least 50% of the thickness of the oxide layer is produced at the first temperature ($T_1$), and at least 20% of the thickness of the oxide layer is produced at the second temperature ($T_2$).

17. The method of claim 16, wherein the formed oxide layer has a thickness between 200 nm and 400 nm.

18. The method of claim 17, wherein the charge-trapping layer has a thickness between 20 nm and 500 nm.

19. The method of claim 18, wherein the charge-trapping layer is deposited on the base substrate by low-pressure chemical vapor deposition in a reactor.

* * * * *

UNITED STATES PATENT AND TRADEMARK OFFICE
CERTIFICATE OF CORRECTION

| | |
|---|---|
| PATENT NO. | : 12,183,624 B2 |
| APPLICATION NO. | : 17/414858 |
| DATED | : December 31, 2024 |
| INVENTOR(S) | : Marcel Broekaart and Damien Parissi |

Page 1 of 1

It is certified that error appears in the above-identified patent and that said Letters Patent is hereby corrected as shown below:

On the Title Page
In ITEM (57) ABSTRACT, Lines 4-5, change "radiofrequency application comprises" to --radiofrequency applications comprises--

In the Specification
Column 9, Lines 36-37, change "layer of 4000 angstroms. It has" to --layer of 4000 angströms. It has--

Signed and Sealed this
Seventeenth Day of June, 2025

Coke Morgan Stewart
*Acting Director of the United States Patent and Trademark Office*